(12) United States Patent
Bünter

(10) Patent No.: US 9,952,702 B2
(45) Date of Patent: Apr. 24, 2018

(54) INPUT DEVICE AND METHOD OF GENERATING A CONTROL SIGNAL

(71) Applicant: Inventio AG, Hergiswil (CH)

(72) Inventor: Adrian Bünter, Giswil (CH)

(73) Assignee: INVENTIO AG, Hergiswil (CH)

( * ) Notice: Subject to any disclaimer, the term of this patent is extended or adjusted under 35 U.S.C. 154(b) by 0 days.

(21) Appl. No.: 14/439,695

(22) PCT Filed: Oct. 22, 2013

(86) PCT No.: PCT/EP2013/072081
§ 371 (c)(1),
(2) Date: Apr. 30, 2015

(87) PCT Pub. No.: WO2014/067817
PCT Pub. Date: May 8, 2014

(65) Prior Publication Data
US 2015/0324050 A1 Nov. 12, 2015

(30) Foreign Application Priority Data

Oct. 31, 2012 (EP) .................................. 12190817

(51) Int. Cl.
*G06F 3/00* (2006.01)
*G06F 3/041* (2006.01)
(Continued)

(52) U.S. Cl.
CPC .......... *G06F 3/0414* (2013.01); *B66B 5/0087* (2013.01); *B66B 11/0246* (2013.01);
(Continued)

(58) Field of Classification Search
CPC ........ G06F 3/0414; G06F 1/16; G06F 3/0416; B66B 3/2007; B66B 11/0246; H03K 17/964
See application file for complete search history.

(56) References Cited

U.S. PATENT DOCUMENTS 4,805,739 A * 2/1989 Lind .................. B66B 1/465
187/395
5,587,567 A * 12/1996 Winter .................. B66B 1/465
187/395
(Continued)

FOREIGN PATENT DOCUMENTS

CN     200996966 Y    12/2007
CN     202063660 U    12/2011
(Continued)

*Primary Examiner* — Kevin M Nguyen
(74) *Attorney, Agent, or Firm* — William J. Clemens; Shumaker, Loop & Kendrick, LLP

(57) ABSTRACT

An input device for generating a control signal includes a control panel, which is formed by a plate-shaped element and has a front side and a rear side, an input zone on the front side, wherein the position of the input zone is marked by a marking on the front side and wherein the control panel is arranged to be deflectable at least in the region of the input zone and a sensor, which is mounted on a region of the rear side opposite the input zone, that detects deflection of the control panel occurring in the region of the input zone, wherein the sensor generates or varies an electrical signal when a user of the input device by exertion of a pressure force on the input zone produces a sufficient deflection of the control panel in the region of the input zone.

12 Claims, 3 Drawing Sheets

(51) Int. Cl.
*B66B 11/02* (2006.01)
*B66B 5/00* (2006.01)
*G06F 1/16* (2006.01)
*H03K 17/96* (2006.01)

(52) U.S. Cl.
CPC .............. *G06F 1/16* (2013.01); *G06F 3/0416* (2013.01); *H03K 17/964* (2013.01); *G06F 2203/04107* (2013.01)

(56) References Cited

U.S. PATENT DOCUMENTS

| | | | |
|---|---|---|---|
| 6,105,729 A | 8/2000 | Nakamori et al. | |
| 6,302,240 B1 * | 10/2001 | Shih | B66B 1/461 187/397 |
| 2007/0089939 A1 | 4/2007 | Liebetrau | |
| 2008/0264731 A1 * | 10/2008 | Mangini | B66B 1/463 187/382 |
| 2008/0303799 A1 * | 12/2008 | Schwesig | G06F 3/0414 345/173 |
| 2009/0146533 A1 * | 6/2009 | Leskinen | G01L 1/16 310/338 |
| 2009/0266648 A1 | 10/2009 | Asensio Bazterra et al. | |
| 2009/0312051 A1 | 12/2009 | Hansson et al. | |
| 2011/0248948 A1 * | 10/2011 | Griffin | G06F 3/041 345/174 |
| 2012/0304550 A1 * | 12/2012 | Teixeira Pinto Dias | B66B 13/306 52/30 |
| 2012/0305340 A1 * | 12/2012 | Wu | B66B 1/34 187/381 |

FOREIGN PATENT DOCUMENTS

| | | |
|---|---|---|
| DE | 10103563 A1 | 8/2002 |
| DE | 102009011558 B3 | 8/2010 |
| EP | 0164662 A1 | 12/1985 |
| WO | 2007089939 A2 | 8/2007 |
| WO | 2009153386 A1 | 12/2009 |
| WO | 2012058777 A1 | 5/2012 |

* cited by examiner

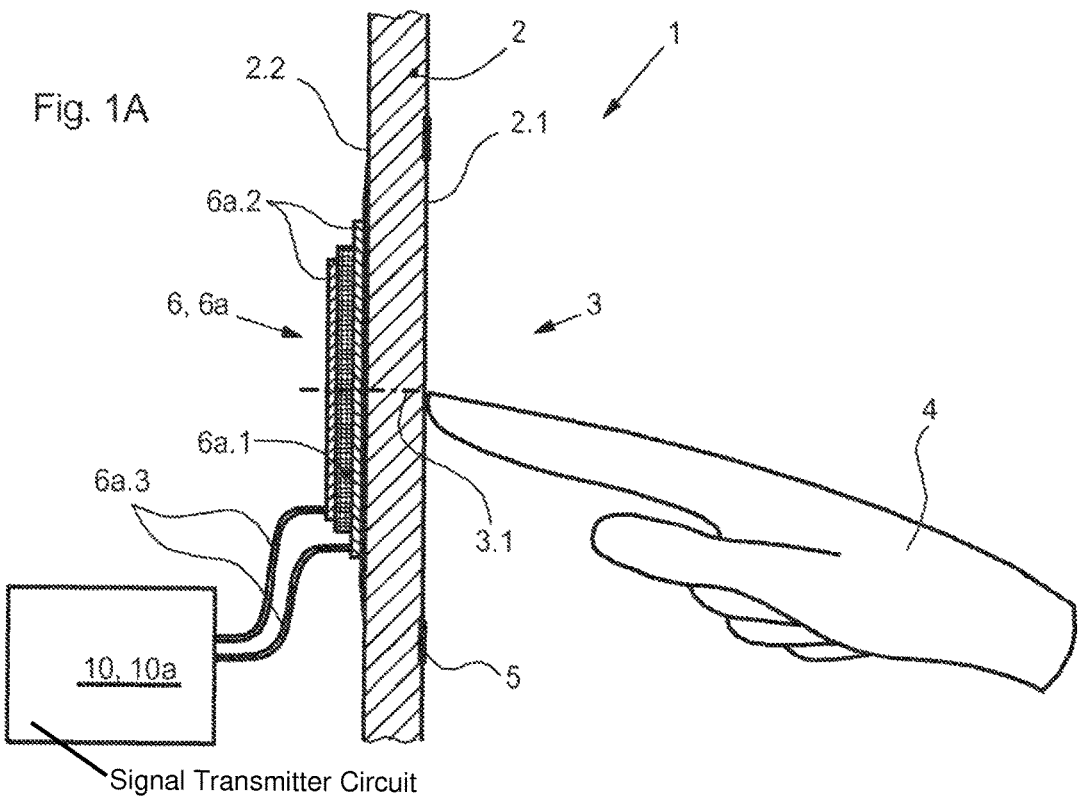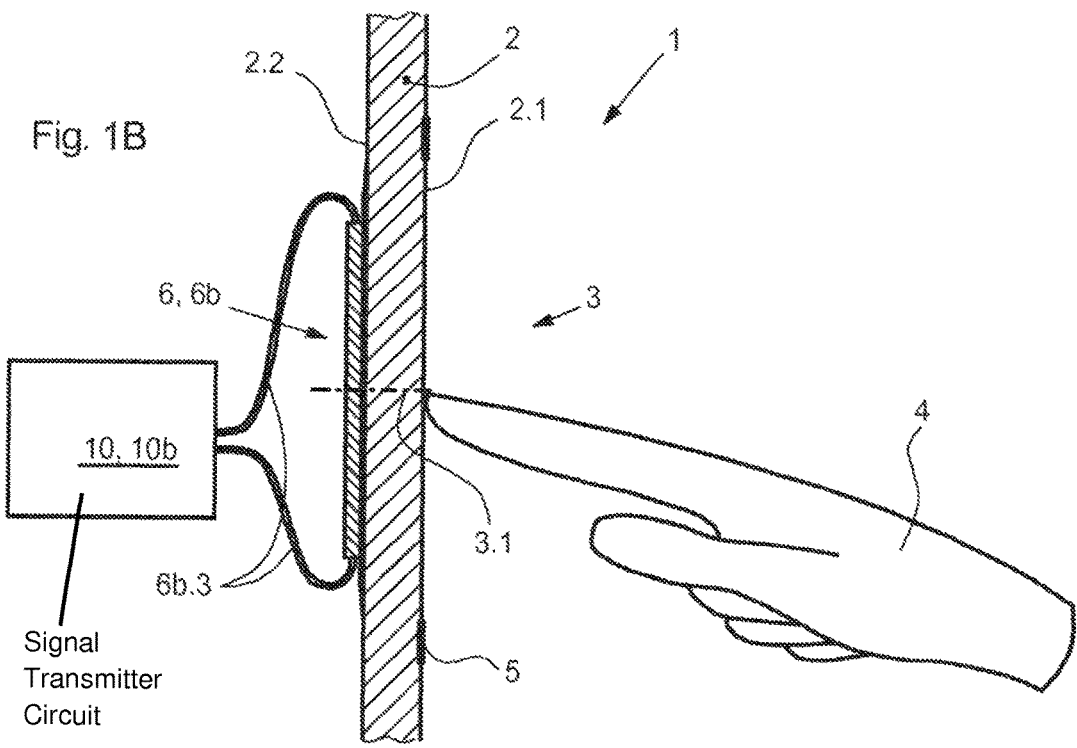

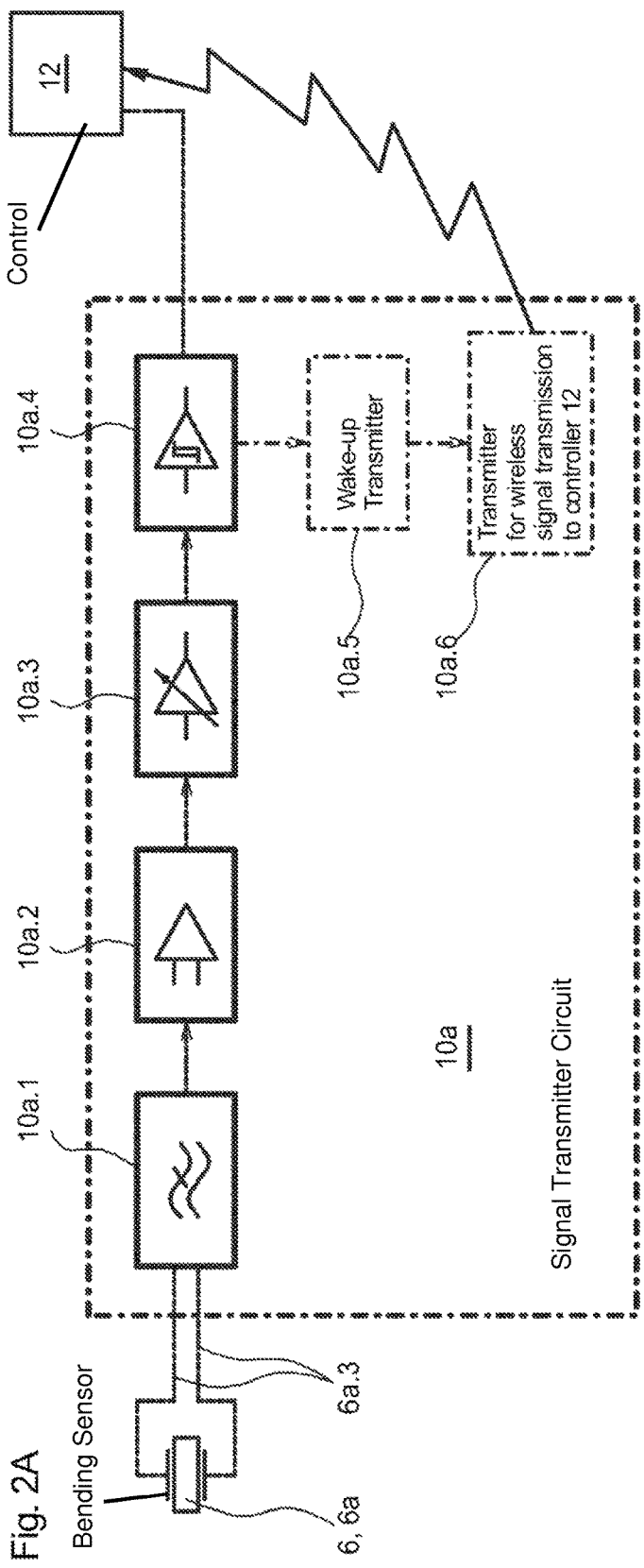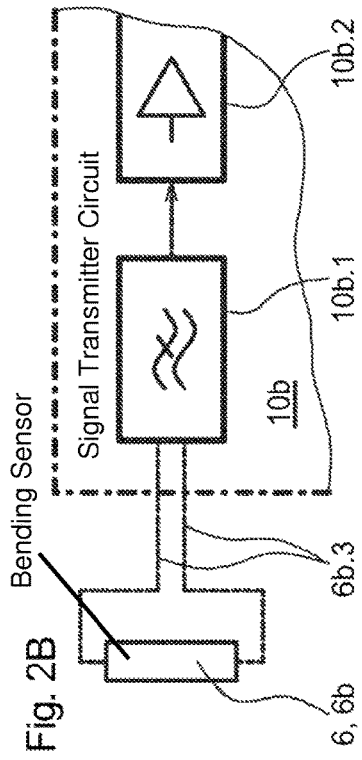

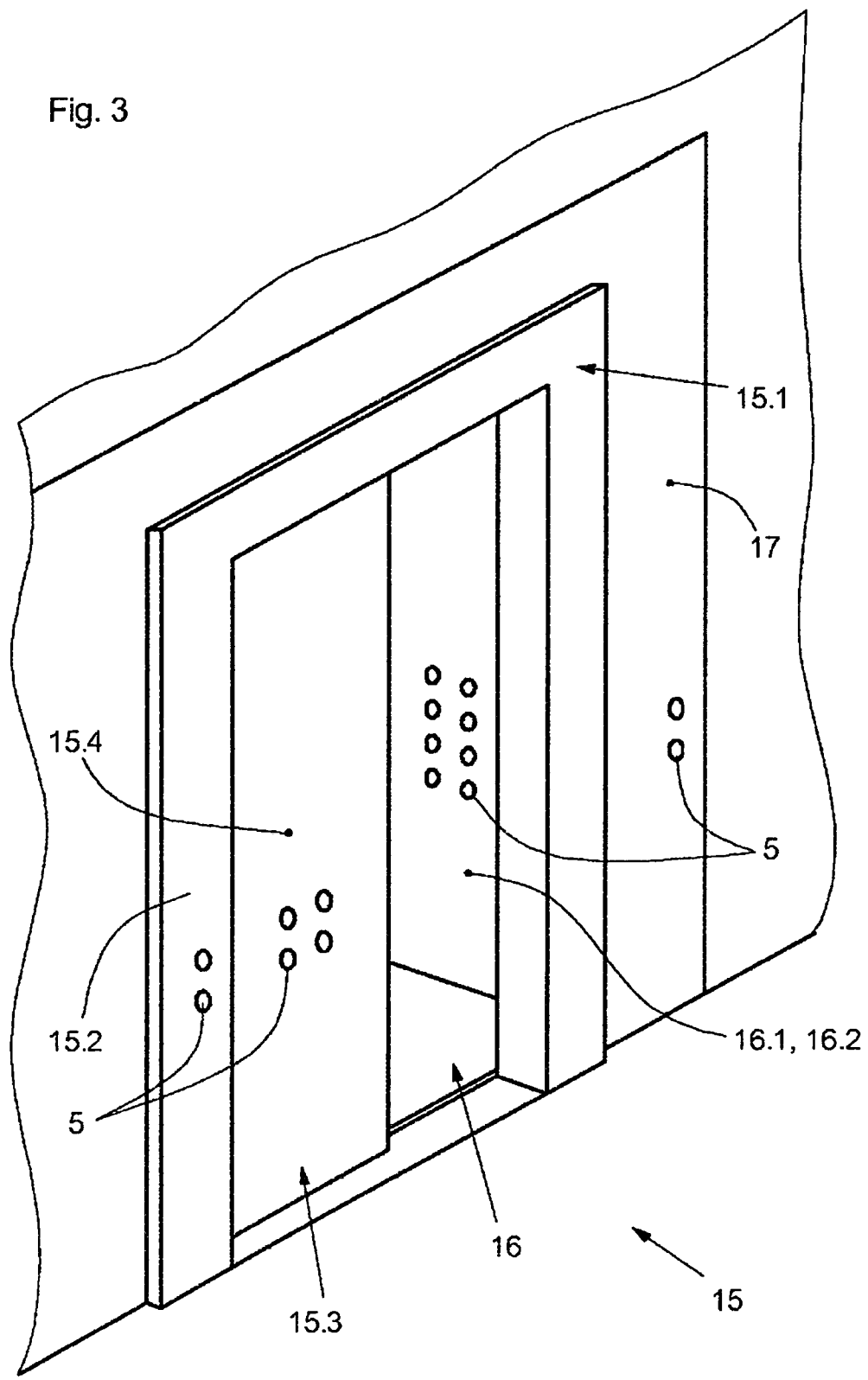

INPUT DEVICE AND METHOD OF GENERATING A CONTROL SIGNAL

FIELD

The invention relates to an input device and a method of generating a control signal by exertion of a pressure force on an input zone of a plate-shaped element.

BACKGROUND

A call input device of an elevator installation, which comprises a control panel for generating electrical control signals for influencing the elevator control, is known from WO 2009/153386 A1. The control panel is a planar non-apertured plate with a plurality of touch-sensitive zones, each of which is associated with a respective one of a plurality of different control signals to be generated. Mounted on the control panel is at least one sensor which detects at the sensor the oscillations of the control panel generated by touching one of the touch-sensitive zones and transmits these to a computer unit. The computer unit compares the detected oscillation data with stored oscillation data, which was generated and stored at the time of a calibration process by touching each of the individual touch-sensitive zones. In the event of agreement of the instantaneously detected oscillation data with the stored oscillation data associated with a specific touch-sensitive zone the call input device generates a control signal which informs the control of the elevator installation that the specific touch-sensitive zone is activated.

SUMMARY

The invention has the object of proposing an input device of the afore-described kind and a method in which detection of touching of a touch-sensitive zone of a control panel formed by a plate-shaped element can be realized by simpler means and therefore with greater functional security and more economically.

As described in the following, the object is fulfilled by an input device as well as by a method for generating a control signal.

Accordingly, an input device for generating a control signal, comprises
  a control panel, which is formed by a plate-shaped element and has a front side and a rear side,
  an input zone on the front side of the control panel, wherein the position of the input zone is marked by means of a marking on the front side of the control panel and wherein the control panel is arranged to be deflectable at least in the region of the input zone and
  a sensor, which is so mounted on a region of the rear side of the control panel opposite the input zone that it detects deflection of the control panel occurring in the region of the input zone.

On the other hand a method of generating a control signal by such an input device comprises the following steps:
  exerting a pressure force on the input zone of the control panel, whereby deflection of the control panel in the region of the input zone and thus deflection of the bending sensor are produced,
  as a consequence of the deflection of the bending sensor an electrical signal is generated or varied by the bending sensor and the electrical signal of the bending sensor is converted by the signal transmitter circuit into a control signal with the desired characteristics.

By the term "plate-shaped element" there are to be understood here block-shaped components or block-shaped regions of components having a thickness or height which is relatively small by comparison with the length and width thereof. The surfaces bounding the thickness of such a "plate-shaped element" form the front side and rear side thereof and are substantially planar. A "plate-shaped element" can consist of, for example, a metal sheet, a plastics material plate or a wood plate.

The feature that the control panel is arranged to be deflectable at least in the region of the input zone or that an input zone is marked in a deflectable region of the control panel mean here that the plate-shaped element forming the control panel is so arranged that at least in the region of the at least one input zone deflection of the control panel can take place without hindrance if a pressure force is exerted on the at least one input zone.

The advantages of the input device and the method for generating a control signal are that for generating a control signal by exertion of a pressure force on an input zone of a control panel formed by a plate-shaped element there is no requirement for a complex evaluating device for detecting, storing and comparing oscillation data of different oscillations excited by the contacting of at least one input zone. In that case merely one signal transmitter circuit with a simple amplifier circuit, which converts the signal of the sensor arising as a consequence of deflection of the control panel into a signal with desired characteristics, is required for each sensor associated with an input zone. A further significant advantage of the input device is that the control panel can be formed by a non-apertured plate-shaped region of any component, for example of a large sheet construction. The solution is therefore substantially less complex overall and therefore more operationally reliable and economic and it makes possible aesthetically more advantageous, contamination-insensitive and vandalproof applications thanks to the possibility of integration of the control panel in existing components.

In an advantageous form of embodiment the sensor generates or varies an electrical signal if a user of the input device produces a sufficient deflection of the control panel in the region of the input zone by exertion of a pressure force on the input zone. It is thus achieved by simplest means that finger pressure on an input zone—or on one of a plurality of possible input zones—of a non-apertured control panel can be converted into an electrical signal of the sensor associated with this input zone. The result is an input device which is insensitive to contamination, vandalproof and thus very operationally reliable.

In a further possible form of embodiment the sensor is so mounted on the region of the rear side of the control panel opposite the input zone that the deflection of the control panel in the region of the input zone produced by the pressure force has the consequence of deformation of the sensor. Such a deformation can be, for example, a bending or stretching deformation. A particularly simple and economic solution for detection of deflection of the control panel in the region of the input zone and thus for detection of a pressure force exerted on the input zone is thus achieved.

In a further possible form of embodiment of the subject of the invention the input device comprises a signal transmitter circuit which in dependence on the electrical signal generated or varied by the sensor generates a control signal with desired characteristics. It is thus achieved that the electrical signal of the sensor produced by finger pressure on an input zone can be converted by simple and economic means into a control signal of the input device with the required characteristics.

In a further possible form of embodiment of the subject of the invention the sensor—or at least one sensor—is constructed as a piezo bending sensor or as a strain-gauge bending sensor. The possibility is thus achieved of detection, by simple, operationally reliable and economic means, of whether a pressure force is exerted on an input zone.

In a further possible form of embodiment at least one sensor is glued on a region of the rear side of the control panel opposite an input zone. It is thus achieved that it is possible to realize operationally reliable detection of a pressure force by proprietary and economic means and with less production outlay, which pressure force is, for example, exerted in the form of finger pressure on a control panel constructed as an aperture-free plate. An alternative solution consists in that the sensor is not glued on the region of the rear side of the control panel opposite the input zone, but is only resiliently pressed against this region.

In a further possible form of embodiment at least one signal transmitter circuit of the input device comprises a low-pass filter, which reduces disturbing oscillations of the electrical signal of the sensor. Such disturbing oscillations can be caused by finger pressure in the case of the exertion of a pressure force on an input zone of the control panel by a user of the input device or by other disturbance sources, for example by vibrations of the control panel. With the use of a low-pass filter such sources of disturbance are largely eliminated and operational reliability of the input device is thereby increased.

In a further possible form of embodiment at least one signal transmitter circuit of the input device comprises at least one amplifier circuit which amplifies the electrical signal of the sensor. This has, in particular, the advantage that the control signal obtained from the electrical signal and to be transmitted by the input device over a relatively large distance is of sufficient strength and is sensitive relative to interference signals.

In the case of a further possible form of embodiment at least one signal transmitter circuit of the input device comprises an amplifier circuit with settable, variable amplification. It can thereby be achieved, for example, that a signal of a sensor is particularly strongly amplified if the sensor belongs to a control panel formed by a plate-shaped element with increased deflection resistance.

A further possible form of embodiment is distinguished by the fact that at least one of the signal transmitter circuits of the input device comprises a threshold value circuit which converts the amplified electrical signal, which is dependent on the dynamics of the exertion of the pressure force, of the sensor into a square wave signal. There is thus guaranteed a transmission, which is capable of unique interpretation and is reliable, of the generated control signal.

In a further possible form of embodiment the input device is so designated that:
the control panel comprises a plurality of input zones and a plurality of sensors,
a respective sensor is mounted on the regions of the rear side of the control panel opposite each of the input zones,
the input device comprises a plurality of signal transmitter circuits, each of which is connected with a respective one of the sensors and thus associated with a respective one of the input zones and one of the sensors generates or varies an electrical signal and the signal transmitter circuit connected with this sensor generates a control signal with desired characteristics when a pressure force is exerted on the input zone associated with this sensor.

It is thus achieved that a plurality of input zones can be arranged on an aperture-free, contamination-proof and vandalproof control panel and an associated control signal can be generated for each of the input zones with operational reliability and economically.

A further possible form of embodiment is distinguished by the fact that the input device is part of an elevator installation and serves the purpose of generating at least one control signal for influencing a control of the elevator installation by an elevator user. It is thus achieved that elevator installations can be equipped economically with contamination-insensitive, vandal-resistant and operationally reliable input devices for control commands.

A further possible form of embodiment is distinguished by the fact that the control panel of the input device is
a plate-shaped element of a shaft door frame of sheet steel or
part of a plate-shaped front panel of a shaft door leaf of sheet steel or
part of a plate-shaped wall cladding at the floor or
part of a plate-shaped elevator car wall or part of a plate-shaped car wall cladding of an elevator car of the elevator installation.

Such a form of embodiment of the input device has the significant advantages that it can be positioned with particularly little effort and can therefore be realized particularly economically.

In a further possible form of embodiment the input device comprises a transmitter which transmits the generated control signals wirelessly to a receiver of an elevator control. This has, in particular, the advantage that it is not necessary to lay any lines between the elevator control and a multiplicity of input devices arranged on the floors of the elevator installation, for example elevator call devices. The simplifications resulting therefrom produce significant cost savings particularly in the case of elevator installations with multiple floors.

DESCRIPTION OF THE DRAWINGS

Embodiments of the invention are explained in the following by way of the accompanying drawings, in which:

FIG. 1A shows a section through a control panel according to a first form of embodiment of an input device, FIG. 1B shows a section through a control panel according to a second form of embodiment of an input device, FIG. 2A shows a block diagram with principal components and functions of an input device with a first form of embodiment of a bending sensor, FIG. 2B shows the block diagram according to FIG. 2A of an input device with a second form of embodiment of a bending sensor and FIG. 3 shows a view of a shaft door and an elevator car, which is positioned therebehind, of an elevator installation with possibilities of arrangement of input devices or of the marked input zones of such input devices.

DETAILED DESCRIPTION

FIG. 1A and FIG. 1B each show a section through an input device 1 for generating at least one control signal. The input device 1 comprises a control panel 2, which is formed by a plate-shaped element, for example a sheet-metal plate, a plastics material plate or a wood plate. Provided on the front side 2.1 of the control panel 2 is at least one input zone 3, on which a user 4 can exert a pressure force in order to have the effect that the input device generates a control signal associated with this input zone. The position of the input zone 3 is marked on the control panel 2 by means of a marking 5, which in this embodiment is illustrated as a circle around the center 3.1 of the input zone 3. The marking 5 can, however, also be formed in other ways, for example as a circular area or as a crosshair so as to characterize the center of the input zone. Such a marking can be applied by, for example, engraving, etching, painting or also by gluing on a film, which is printed with the marking, on the front side 2.1 of the control panel 2.

In addition, the input device 1 comprises at least one sensor 6, which is so mounted on a region of the rear side of the control panel 2 opposite the input zone that it can detect a deflection, which is produced by exertion of a pressure force, of the control panel in the region of the input zone 3. For this purpose the sensor 6 is preferably glued by means of a suitable adhesive to the rear side of the control panel 2.

In the first form of embodiment of the input device 1 illustrated in FIG. 1A the sensor 6 is present in the form of a piezo bending sensor 6a which detects deflection, which is produced by the exertion of a pressure force, of the control panel 2. This piezo bending sensor 6a is so glued onto the region of the rear side 2.2 of the control panel opposite the input zone 3 that it experiences substantially the same deflection as the control panel 2 in the region of the input zone 3. Such a piezo bending sensor essentially comprises a piezo-ceramic plate 6a.1 with two (large) outer surfaces which are respectively connected with metallic surface electrodes 6a.2. Deflection of such a piezo bending sensor produces pressure stresses in the zones of the piezo-ceramic plate 6a.1 lying adjacent to one of the large outer surfaces and tension stresses in the zones lying adjacent to the other one of the large outer surfaces. On generation of the deflection or pressure and tension stresses smallest mechanical displacements of charge carriers arise in transverse direction with respect to the large outer surfaces in the piezo-ceramic plate 6a.1, which has the consequence of charge differences between these outer surfaces or between the surface electrodes 6a.2 conductively connected with these outer surfaces. These charge differences manifest themselves as an electrical signal, which is dependent on the strength of the deflection, of the piezo bending sensor 6a. This electrical signal is passed on by way of the connecting wires 6a.3 and evaluated by a signal transmitter circuit, which is described in more detail in the following and here denoted by the reference numeral 10a, in order to generate a control signal when a force is exerted on the input zone of the control panel.

In the case of the second embodiment of the input device 1 illustrated in FIG. 1B the sensor 6 is present in the form of a strain-gauge bending sensor 6b which detects the deflection, which is produced by exertion of a pressure force, of the control panel 2 in the region of the input zone 3. This strain-gauge bending sensor 6b is so glued onto the region of the rear side 2.2 of the control panel opposite the input zone 3 that in the case of deflection of the control panel it experiences the same strain as the stated region of the rear side 2.2 of the control panel.

Such a strain-gauge bending sensor usually comprises a thin conductor track which is applied by plating to a carrier film and which is arranged in meander shape, wherein the largest part of the conductor track length runs parallelly to a longitudinal direction of the strain gauge. If such a strain gauge is glued onto a component in such a way that the longitudinal direction of the strain gauge extends parallelly to a direction in which the surface of the component experiences strain then the electrical resistance of the entire conductor length and thus of the strain gauge changes due to the strain.

In the case of the second embodiment of the input device 1 illustrated in FIG. 1B the control panel 2 is deflected by exertion of a pressure force in the region of the input zone 3 so that the rear side of the control panel experiences, in the region of this input zone, a corresponding strain which is transmitted to the strain-gauge bending sensor glued to this region. As a consequence of this strain of the strain gauge of the strain-gauge bending sensor 6b the electrical resistance of the strain-gauge bending sensor 6b changes. If the strain-gauge bending sensor 6b is connected by way of its connecting wire 6b.3 to a signal transmitter circuit, which is described in the following and here denoted by the reference numeral 10b, then exertion of a force on the input zone 3 of the control panel 2 produces a change, which is dependent on the strength of the force, in a voltage drop in the current circuit of the strain-gauge bending sensor 6b. This voltage drop is evaluated by the signal transmitter circuit 10b as an electrical signal of the strain-gauge bending sensor 6b so as to generate a control signal when a force is exerted on the input zone of the control panel.

An input device can comprise a control panel 2 which comprises a plurality of mutually adjacent input zones 3 and a plurality of sensors 6 each associated with a respective one of the input zones. In that case, a respective transmitter circuit 10 is associated with each input zone and thus each of the sensors 6, wherein each of the signal transmitter circuits generates a control signal with desired characteristics when the sensor associated therewith generates or varies an electrical signal because a pressure force has been exerted on the input zone associated with this sensor.

An installation space for the at least one sensor 6 fixed to the control panel is present adjacent to the rear side of the control panel 2 in the region of the at least one input zone 3. Moreover, the control panel is still sufficiently deflectable even after mounting of the at least one sensor at least in the region of the at least one input zone. Since the thickness of a provided sensor lies in the order of magnitude of one millimeter and the deflection of the control panel in the region of the input zone in the usual case of use is at most a few tenths of a millimeter a cavity, which adjoins the rear side of the control panel, of approximately two millimeters thickness is sufficient.

As an alternative to gluing of the at least one sensor 6 on the region of the rear side 2.2 of the control panel 2 opposite the input zone 3 the sensor 6 can also be resiliently pressed against the stated rear side of the control panel by means of a mount. Deflection of the control panel 2 in the region of the input zone 3 can also be transmitted in this way to the piezo bending sensor 6a or to the strain-gauge bending sensor 6b.

FIG. 2A and FIG. 2B show block circuit diagrams of signal transmitter circuits 10, which are provided for the purpose of generating a control signal with desired characteristics in dependence on the electrical signal generated or varied by a sensor 6, i.e. in dependence on the presence and on the strength of a force exerted on an associated input zone of the control panel. The signal transmitter circuits according to FIG. 2A and FIG. 2B differ from one another by the fact that they co-operate with different forms of embodiment of the sensor 6 described in the foregoing in connection with FIGS. 1A and 1B, which sensor 6 serves the purpose of detecting deflection of an associated input zone. Due to the different sensors the two signal transmitter circuits have, in part, different components.

FIG. 2A shows a signal transmitter circuit 10*a* with which a sensor 6 in the form of a piezo bending sensor 6*a* is connected. As described in the foregoing, the piezo bending sensor 6*a* generates charge differences between two surface electrodes when it experiences deflection. The charge differences manifest themselves as an electrical signal which is dependent on the strength of the deflection and which is passed on by way of connecting wires 6*a*.3 to the input of the signal transmitter circuit 10*a*. The signal of the piezo bending sensor 6*a* is smoothed by means of a low-pass filter 10*a*.1 of the signal transmitter circuit 10*a* and passed on to an amplifier circuit 10*a*.2 in the form of a charge amplifier. Disturbing oscillations of the electrical signal of the sensor are reduced by the smoothing, which disturbing oscillations are caused by, for example, vibrations of the control panel or by the kind of finger pressure.

The mentioned charge amplifier 10*a*.2 converts the electrical charge, which corresponds with the smoothed signal of the sensor, into a voltage approximately proportional thereto. This voltage is subsequently amplified by an amplifier circuit 10*a*.3 in the form a voltage amplifier with a settable variable amplification and is supplied to a threshold value circuit 10*a*.4 in the form of a Schmitt trigger. The settable variable amplification makes it possible to adapt the signal transmitter circuit to different cases of use, for example to different control panels, which experience deflections to different extent for the same pressure force on the input zone. The object of the threshold value circuit 10*a*.4 is to transform the amplified signals, which continuously change in correspondence with the exerted pressure force, of the sensor into square wave signals, i.e. abruptly switch over an output signal for controlling a device between two voltage levels for respective defined voltage levels of the amplified signals of the sensor.

The output signal of the threshold value circuit 10*a*.4 of the signal transmitter circuit 10*a* can be transmitted as a control signal to a control 12 of the device by way of a signal line. According to one of the possible forms of embodiment of the input device the said output signal of the threshold value switch 10*a* can, however, also be transmitted to a transmitting device 10*a*.6 which converts the said output signal into a wirelessly transmissible control signal and transmits this to an appropriate signal receiver of the control 12 of a device. In order that the transmitting device 10*a*.6 is activated, and thus consumes energy, only when a control signal is to be transmitted, a wake-up circuit 10*a*.5 can be present, which activates the transmitter device when the threshold value 10*a* generates an output signal.

FIG. 2B shows a detail of a signal transmitter circuit 10*b* with which a sensor 6 in the form of a strain-gauge bending sensor 6*b* is connected. As described in the preceding in connection with FIG. 1B the exertion of a pressure force on the input zone produces a strain of the strain-gauge bending sensor, whereby the electrical resistance thereof and thus the voltage signal conducted via one of the connecting wires 6*b*.3 from the strain-gauge bending sensor 6*b* to the input of the signal transmitter circuit 10*b* change approximately in proportion to the stated pressure force. The signal of the strain-gauge bending sensor 6*b* is smoothed by means of a low-pass filter 10*b*.1 of the signal transmitter circuit 10*b* and passed on to an amplifier circuit 10*b*.2 in the form of a voltage amplifier. The remaining components and functions of the signal transmitter circuit 10*b* correspond with the afore-described components 10*a*.3 to 10*a*.6 of the signal transmitter circuit 10*a* and the functions thereof.

The input device can be a part of an elevator installation, in which case it makes it possible for an elevator user to generate a control signal for influencing the control 12 of the elevator installation, for example in that the elevator user by finger pressure on an input zone of a control panel formed by a component of the elevator installation calls the elevator car to a specific floor.

FIG. 3 shows a shaft door 15 and an elevator car 16 positioned therebehind of an elevator installation with possibilities of arrangement of input devices. In that case, of the different input devices in each instance only the markings 5 indicating input zones are visible, since the control panels containing the input zones of the markings 5 are formed by plate-shaped elements or plate-shaped regions of components of the elevator installation. The following components containing plate-shaped elements or plate-shaped regions suitable for forming a control panel of an input device according to the invention are recognizable from FIG. 3:

- a door post 15.2 of the shaft door frame 15.1 of sheet metal,
- a plate-shaped shaft wall cladding 17 in the region of the shaft door 15 of sheet metal, plastics material plates, wood plates, etc.,
- a front panel 15.4 of a shaft door leaf 15.3 of sheet metal and
- a car wall 16.1 or a car wall cladding 16.2 of the elevator car 16, wherein the car wall or the car wall cladding can consist of sheet metal, plastics material plates, wood plates or plates of another material.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. An elevator installation including an input device for generating a control signal, comprising:
    a control panel formed as a plate-shaped element and having a front side and a rear side, wherein the control panel is: a part of a plate-shaped front panel of a shaft door leaf formed of sheet steel; a part of a plate-shaped wall cladding at a floor in the elevator installation; a part of a plate-shaped elevator car wall; or a part of a plate-shaped car wall cladding of an elevator car of the elevator installation;
    an input zone on the front side of the control panel, wherein a position of the input zone is marked by a marking on the front side and wherein the control panel is deflectable at least in the input zone; and
    a sensor mounted on the rear side of the control panel opposite the input zone, the sensor generating an electrical signal upon detecting deflection of the control panel occurring in the input zone, the electrical signal being convertible into the control signal, the sensor being a piezo bending sensor or a strain-gauge bending sensor;
    wherein the control signal influences control of the elevator installation.

2. The elevator installation according to claim 1 wherein the sensor generates the electrical signal when a user of the input device produces a predetermined deflection of the control panel in the input zone through exertion of a pressure force on the input zone.

3. The elevator installation according to claim 2 wherein the sensor is mounted on the rear side of the control panel so that the deflection of the control panel, which is produced by the exertion of the pressure force, in the input zone deforms the sensor.

4. The elevator installation according to claim 1 wherein the sensor is glued onto the rear side of the control panel opposite the input zone.

5. The elevator installation according to claim 1 including a signal transmitter circuit connected to the sensor that generates a control signal in response to the electrical signal generated by the sensor.

6. The elevator installation according to claim 5 wherein the signal transmitter circuit includes a low-pass filter that reduces interfering oscillations of the electrical signal from the sensor.

7. The elevator installation according to claim 5 wherein the signal transmitter circuit includes an amplifier circuit that amplifies the electrical signal from the sensor.

8. The elevator installation according to claim 7 wherein the amplifier circuit has a settable variable amplification.

9. The elevator installation according to claim 7 wherein the signal transmitter circuit includes a threshold value circuit that converts the amplified electrical signal into the control signal in a form of a square wave signal.

10. A method of generating the control signal by the elevator installation according to claim 1, the method comprising the steps of:
    exerting a pressure force on the input zone of the control panel, whereby deflection of the input zone and the sensor are produced;
    in response to the deflection of the sensor, generating the electrical signal from the sensor; and
    converting the electrical signal into the control signal with desired characteristics using a signal transmitter circuit.

11. An elevator installation including an input device for generating control signals, comprising:
    a control panel having a front side and a rear side, the control panel having a plurality of input zones formed on the front side, wherein the control panel is: a part of a plate-shaped front panel of a shaft door leaf formed of sheet steel; a part of a plate-shaped wall cladding at a floor in the elevator installation; a part of a plate-shaped elevator car wall; or a part of a plate-shaped car wall cladding of an elevator car of the elevator installation;
    a plurality of sensors, each of the sensors being mounted on the rear side of the control panel opposite an associated one the input zones, each of the sensors being a piezo bending sensor or a strain-gauge bending sensor;
    a plurality of signal transmitter circuits, each of signal transmitter circuits being connected with an associated one of the sensors; and
    each of the sensors generating an electrical signal to the associated signal transmitter circuit to generate a control signal with desired characteristics from the associated signal transmitter circuit when a pressure force is exerted on the associated input zone;
    wherein each control signal influences control of the elevator installation.

12. The elevator installation according to claim 11 wherein the input device includes a transmitter that wirelessly transmits the control signal to an elevator control.

* * * * *